United States Patent

[11] 3,566,210

[72] Inventor Angelo Louis DeCecco
Newtown Square, Pa.

[21] Appl. No. 674,946
[22] Filed Oct. 12, 1967
[45] Patented Feb. 23, 1971
[73] Assignee General Electric Company

[54] SEMICONDUCTOR SWITCHING DEVICE HAVING A SHORTED EMITTER
6 Claims, 2 Drawing Figs.

[52] U.S. Cl. .......... 317/235, 317/234
[51] Int. Cl. .......... H01l 11/00, H01l 15/00
[50] Field of Search .......... 317/235, 41.1, 234, 44, 46

[56] References Cited

UNITED STATES PATENTS

| | | | |
|---|---|---|---|
| 3,335,296 | 8/1967 | Smart | 317/235 |
| 3,422,323 | 1/1969 | Whoriskey | 317/235 |
| 3,437,889 | 4/1969 | Eugster | 317/235 |
| 3,443,171 | 5/1969 | Knott et al. | 317/235 |
| 3,239,728 | 3/1966 | Aldrich et al. | 317/235 |
| 3,280,392 | 10/1966 | Benda | 317/235 |
| 3,337,782 | 8/1967 | Todaro, Jr. | 317/235 |
| 3,337,783 | 8/1967 | Stehney | 317/235 |
| 3,343,048 | 9/1967 | Kuehn et al. | 317/234 |

FOREIGN PATENTS

| | | | |
|---|---|---|---|
| 901,239 | 7/1962 | Great Britain | 317/235 |
| 233,119 | 4/1964 | Austria | 317/235 |

*Primary Examiner*—John W. Huckert
*Assistant Examiner*—Andrew J. James
*Attorney*—J. Wesley Haubner, Albert S. Richardson, Jr., Frank L. Neuhauser, Oscar B. Waddell and Melvin M. Goldenberg

ABSTRACT: The temperature and transient turn-on sensitivities of a high-power solid-state PNPN switching device can be reduced by using an inboard auxiliary region in one end layer (the emitter) of the device for triggering purposes and by spanning all external edges of the emitter junction with a low resistance shunt.

Figure 1:
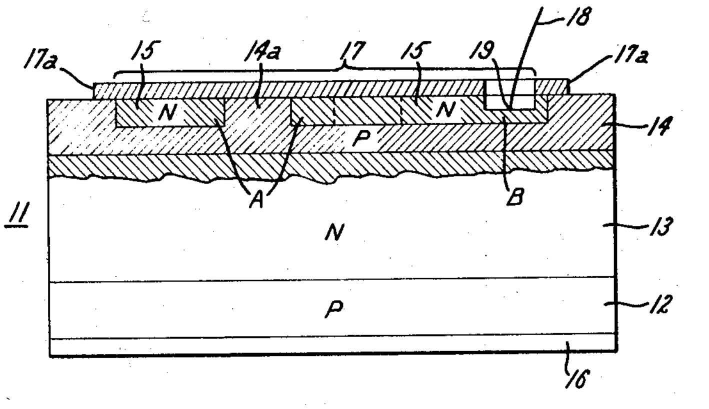

INVENTOR:
ANGELO L. DECECCO,
BY Albert S. Richardson Jr.
ATTORNEY

SEMICONDUCTOR SWITCHING DEVICE HAVING A SHORTED EMITTER

This invention relates generally to solid-state electric current switches of the multilayer semiconductor type, and more particularly it relates to a high power silicon controlled rectifier (known generally as a thyristor or SCR) having improved switching characteristics.

Typically an SCR comprises a thin, broad area disclike body having four distinct layers of semiconductor material (silicon), with contiguous layers being of different conductivity types to form three back-to-back PN (rectifying) junctions in series. A pair of main current-carrying electrodes (anode and cathode) are provided in low resistance (ohmic) contact with the outer surfaces of the respective end layers of the silicon body, and for triggering conduction between these electrodes the body is normally equipped with at least one control electrode (gate contact). To complete the device the silicon body is sealed in an insulating housing, and it can be externally connected to associated electric power and control circuits by means of its main and control electrodes.

In such a device the end layer that subtends the cathode is sometimes referred to as the emitter, and the rectifying junction between the emitter and the facing intermediate layer is known as the emitter junction. It is a familiar practice in making broad area semiconductor devices to reduce emitter efficiency by providing a conductive path across the emitter junction. This "shorted emitter" construction improves the temperature stability and the dv/dt withstand ability of the SCR. Those skilled in the art are aware that the degree to which these desired objectives are actually realized will increase with the quality of the short. In other words, the lower the resistance of the short, and the more area of the interface that is shorted, the better the results. Nevertheless, in practical embodiments of the prior art a shorted emitter of ideal quality has been unattainable because in the vicinity of the gate contact, to avoid a gate-cathode short circuit, the path shunting the emitter has had too high a resistance or has been omitted altogether. Accordingly, a general object of the present invention is to overcome this shortcoming of the prior art.

In carrying out the invention in open form, a body of semiconductor material is disposed between first and second spaced-apart main electrodes. The semiconductor body has a plurality of layers arranged in succession, with contiguous layers being of different conductivity types so that rectifying junctions are formed therebetween. A first one of the opposite end layers of semiconductor material is provided with juxtaposed main and auxiliary regions, the former being disposed in relatively broad area contact with the first main electrode and the auxiliary region being free of that electrode. The auxiliary region is given a relatively high lateral resistance, and it has an exposed face on which impinges means for triggering the device from a relatively high impedance nonconducting state to a low impedance conducting state. Every external edge of the rectifying junction between the first end layer and the intermediate layer contiguous therewith is spanned by electroconductive material of negligible resistance, whereby the entire perimeter of the aforesaid first end layer is conductively joined to the intermediate layer without short circuiting the triggering means.

Figure 2:
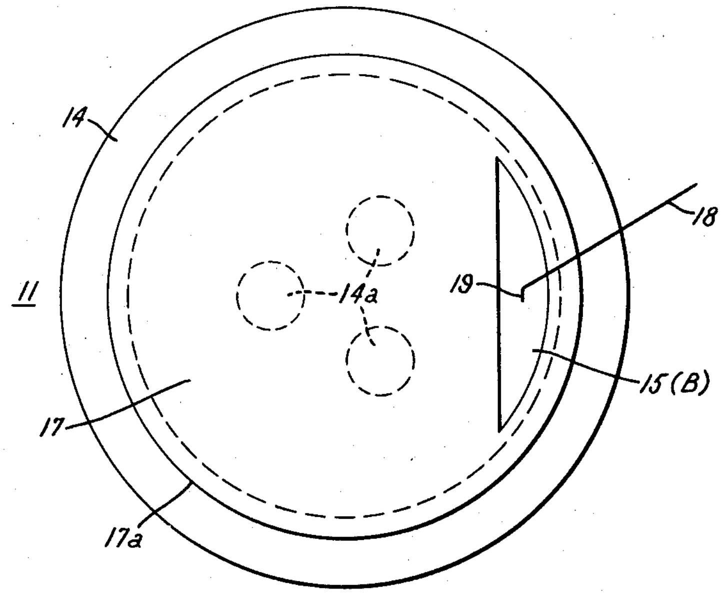

My invention will be better understood and its various objects and advantages will be more fully appreciated from the following description taken in conjunction with the accompanying drawing in which:

FIG. 1 is an elevational view, partly in section and not to scale, of a semiconductor switching device constructed in accordance with one form of my invention; and FIG. 2 is a plan view of the device shown in FIG. 1.

Referring now to the drawing, I have shown a disclike asymetrically conductive body 11 comprising four circular layers or zones 12, 13, 14, and 15 of semiconductor material (preferably silicon) arranged in succession between a pair of main current-conducting electrodes comprising metallic contacts 16 and 17. Contiguous layers of the body 11 are of different conductivity types, and their interface boundaries thereby form rectifying junctions. More particularly, as is shown in FIG. 1, the lower end layer 12 of the body 11 is of P-type conductivity, the contiguous internal layer 13 is of N-type conductivity, the next intermediate layer 14 is of P-type conductivity, and the upper end layer 15 is of N-type conductivity. One of the main electrodes 16 is superimposed on and bonded to the P-type end layer 12 in a manner forming a low resistance ohmic junction therewith, and this electrode is referred to as an anode of the illustrated device. The companion main electrode 17 is a thin gold disc connected in a similar manner to the opposite N-type end layer 15 of the body 11 and is referred to as a cathode.

In the illustrated embodiment of my invention, a gate lead 18 is connected to the exposed minor face of a relatively small auxiliary region B of the end layer 15. The auxiliary region B, which is located inboard with respect to the laterally adjoining main region A of the layer 15, is free of connections to the cathode 17, and it is made thinner than the main region so that its lateral resistance is relatively high. The gate lead 18 preferably comprises an aluminum wire which is directly joined to the auxiliary region B by welding or the like thereby to form a control electrode or contact 19 which is spaced from the edges of the auxiliary region as shown.

The above-described device can be constructed by any of a number of different techniques that are known in the semiconductor art today. See, for example, copending U.S. Pat. application Ser. No. 602,837-McIntyre et al., filed Dec. 19, 1966, and assigned to the assignee of the present application now U.S. Pat. No. 3,489,962. While thin solid lines and distinct hatching have been used in FIG. 1 to illustrate the various interface boundaries in the PNPN body 11, those skilled in the art will understand that these boundaries are not such discretely definable plane surfaces in practice. Although in the present drawing its thickness has been exaggerated for the sake of clarity, the body 11 is really a very thin wafer having a relatively large diameter, e.g., 1 inch or more.

To complete a commercially practical component, the device shown in FIGS. 1 and 2 can be mounted in a hermetically sealed insulating housing of any suitable design, with its electrodes 16, 17, and 18 being respectively connected to separate terminal members of the housing which members in turn are adapted to be connected to external electric circuits in which the device will be used. One example of an improved housing for this purpose is fully disclosed in a copending U.S. Pat. application Ser. No. 585,428-Sias, filed Oct. 10, 1966, and assigned to the assignee of the present application.

In accordance with my invention, the end layer 15 of the silicon body 11 is conductively connected to the contiguous intermediate layer 14 by a metallic path of negligible resistance, thereby shunting the rectifying junction between 15 and 14. As is shown in the drawings, this path comprises an integral extension 17*a* of the cathode 17 that overlaps the whole perimeter of the end layer 15. In addition, the interior of the end layer 15 is provided with a plurality of apertures (only three have been shown) through which nonperipheral parts 14*a* of the intermediate layer 14 are externally accessible, and the cathode 17 is in immediate contact with each of these parts. (Only one of the parts 14*a* can be seen in the elevational view because the device is broken away across its diameter.) Thus every external edge of the rectifying junction between layers 15 and 14 is spanned by electroconductive material comprising an essentially zero-resistance short circuit. In this manner an ideal shorted emitter is obtained without risking a gate-to-cathode short circuit.

In practice the electroconductive material that forms the short circuit across the rectifying junction of the switching device can be deposited by any one of a number of different techniques well known in the art today. For example, a thin layer of aluminum can be evaporated on the upper surface of the body 11 (after first masking the exposed face of the auxiliary region B). Or tungsten can be electroplated or sputtered on this surface. Or gold, copper, and gold can be sputtered thereon.

While I have shown and described a preferred form of my invention by way of example, many modifications will probably occur to those skilled in the art. I therefore contemplate by the claims which conclude this specification to cover all such modifications as fall within the true spirit and scope of my invention.

I claim:

1. An improved semiconductor switching device comprising first, second, third, and fourth layers of semiconductor material arranged in the named order between first and second main electrodes, with said first and third layers being of one conductivity type and said second and fourth layers being of the opposite conductivity type so that rectifying junctions are formed between contiguous layers, said first layer of semiconductor material comprising laterally adjoining main and auxiliary regions of said one conductivity type, said main region being disposed in relatively broad area contact with the first main electrode and said auxiliary region being free of said main electrodes, said device being adapted to be triggered from a relatively high impedance nonconducting state to a low impedance conducting state by gating means impinging on said auxiliary region of said first layer, wherein the improvement comprises:

a. metallic means for conductively connecting said first layer to said second layer of semiconductor material, whereby the rectifying junction between said first and second layers is shunted by a path of relatively low impedance;
b. said metallic means being spaced from said gating means.

2. The device of claim 7 in which said first layer has at least one aperture through which at least one nonperipheral part of said second layer is externally accessible, and said metallic means is in contact with said part.

3. The device of claim 7 in which the auxiliary region is located inboard with respect to the main region of said first layer, and said first main electrode has an aperture through which said auxiliary region is exposed.

4. The device of claim 3 in which said metallic means comprises an integral extension of said first main electrode, which extension overlaps every external edge of the rectifying junction between said first and second layers.

5. An improved semiconductor switching device comprising a disclike body having first, second, third, and fourth layers of semiconductor material arranged in the named order between first and second main electrodes, with said first and third layers being of one conductivity type and said second and fourth layers being of the opposite conductivity type so that rectifying junctions are formed between contiguous layers, said first layers of said body comprising juxtaposed main and auxiliary regions of said one conductivity type, said main region being disposed in relatively broad area contact with the first main electrode and said auxiliary region being free of said main electrodes, said device being adapted to be triggered from a nonconducting state to a conducting state by gating means impinging on said auxiliary region of said first layer, wherein the improvement comprises:

b. electroconductive means spanning every external edge of the rectifying junction between said first and second layers of said body, whereby the perimeter of said first layer is conductively connected to said second layer by a path of relatively low resistance; and
b. said electroconductive means being spaced from said gating means.

6. The switching device of claim 5 in which said electroconductive means has negligible resistance.